United States Patent
Bentz et al.

[11] Patent Number: 5,922,991
[45] Date of Patent: Jul. 13, 1999

[54] ARRANGEMENT FOR MOUNTING A WIRING HARNESS ON A SUPPORT PLATE

[75] Inventors: Willy Bentz, Sachsenheim; Paul Hermanutz, Gomaringen; Waldemar Ernst, Vaihingen/enz, all of Germany

[73] Assignee: Robert Bosch GmbH, Stuttgart, Germany

[21] Appl. No.: 08/825,308

[22] Filed: Mar. 28, 1997

[30] Foreign Application Priority Data

Mar. 29, 1996 [DE] Germany ............ 196 12 599

[51] Int. Cl.⁶ ........................ H02G 3/00
[52] U.S. Cl. ........................ 174/70 R
[58] Field of Search ............ 174/70 R, 260, 174/261, 52.4; 361/777, 779, 826

[56] References Cited

U.S. PATENT DOCUMENTS

| | | | |
|---|---|---|---|
| Re. 35,064 | 10/1995 | Hernandez | 361/763 |
| 4,663,815 | 5/1987 | Hartman et al. | 29/893 |
| 5,295,045 | 3/1994 | Kitano et al. | 361/813 |
| 5,483,740 | 1/1996 | Maslakow | 174/52.2 |

FOREIGN PATENT DOCUMENTS

| | | |
|---|---|---|
| 0 708 583 | 4/1996 | European Pat. Off. . |
| 2 601 826 | 1/1988 | France . |
| 40 23 319 | 12/1991 | Germany . |
| 42 37 870 | 3/1994 | Germany . |

*Primary Examiner*—Nestor Ramirez
*Assistant Examiner*—Joseph Waks
*Attorney, Agent, or Firm*—Kenyon & Kenyon

[57] ABSTRACT

In order to improve an arrangement for mounting a wiring harness on a support plate with a laminated-on substrate for electrical and/or electronic components such that the latter has high reliability while being simpler and thus more economical to manufacture, the connecting wires of the wiring harness are connected in electrically conductive fashion directly to electrical connection elements of the substrate. In the vicinity of this connection, the wiring harness is at least partly embedded into a sealing medium enclosing the connection.

6 Claims, 2 Drawing Sheets

ARRANGEMENT FOR MOUNTING A WIRING HARNESS ON A SUPPORT PLATE

FIELD OF THE INVENTION

The present invention relates to an arrangement for mounting a wiring harness on a support plate with a laminated-on substrate for electrical and/or electronic components.

BACKGROUND INFORMATION

Arrangements of this kind are used, for example, in automotive electronics to connect a wiring harness directly to a control device of the vehicle. A requirement exists in this context for preassembled, tested units which generally also comprise an engine-end wiring harness.

German Patent No. DE 40 23 319 C1, for example, describes an electrical device, in particular a switching and control device for motor vehicles, in which the connection between the wiring harness and the electronic circuit of the control device is created by means of an edge connector that is mounted directly on the support plate. The edge connector is mounted outside a housing on the support plate.

A disadvantage of this type of mounting of the wiring harness is the complex installation of the edge connector on the support plate. Moreover, the plug-in connection itself proves to be subject to malfunction; for example, the contact pins can easily corrode or vibration of the entire arrangement can cause a break in contact.

It is therefore an object of the present invention to improve an arrangement for mounting a wiring harness on a support plate in such a way that it has high reliability while being simpler and thus more economical to manufacture.

SUMMARY OF THE INVENTION

In an arrangement for mounting a wiring harness on a support plate according to the present invention, the connecting wires of the wiring harness are connected in electrically conductive fashion directly to electrical connection elements of the substrate; and in the vicinity of this connection, the wiring harness is at least partly embedded into a sealing medium enclosing the connection.

Direct connection between the connecting wires of the wiring harness and the electrical connection elements of the substrate, and embedding of at least a portion of the wiring harness into a sealing medium which encloses the connection, has the particular advantage of making possible long-lived, corrosion-resistant mounting of the wiring harness to the substrate. In particular, with this arrangement, no contact break can occur due to vibration or the like.

A connection of this kind is moreover particularly simple and therefore economical to manufacture.

In purely theoretical terms, it would be possible to provide an additional apparatus for strain relief of the wiring harness. One particularly advantageous solution, which is highly advantageous in particular with regard to weight saving, provides for the sealing medium simultaneously to constitute a strain relief. In this manner, the strain relief can also be manufactured simultaneously together with the seal arrangement, in one manufacturing step and therefore in particularly simple and economical fashion.

A very wide variety of embodiments is possible in terms of the arrangement of the connecting wires on the electrical connection elements of the substrate. For example, the connecting wires of the wiring harness can be connected directly on the side of the substrate having the electrical connection elements on which the electrical and/or electronic components are also arranged.

Particularly in order to facilitate application of the sealing medium, which is usually processed in fluid form, provision is preferably made for the support plate to have, in the region of the connection, a recess in which the sealing medium receiving the wiring harness is arranged.

In this case, the connecting wires of the wiring harness are connected to connection elements of the substrate that are arranged on the side of the substrate facing away from the side carrying the electrical or electronic components.

A particularly advantageous embodiment provides for the support plate simultaneously to be the bottom plate of a housing of an electrical/electronic control device. Additional mounting fixtures for the wiring harness in the housing of the electrical/electronic control device can thereby be eliminated.

A very wide variety of embodiments is possible in terms of the connection elements. Provision is made, for example, for the connection elements to be solder terminals for punch soldering. In addition, the connection elements can constitute a post block connected in electrically conductive fashion to the substrate.

DETAILED DESCRIPTION

Figure 1:
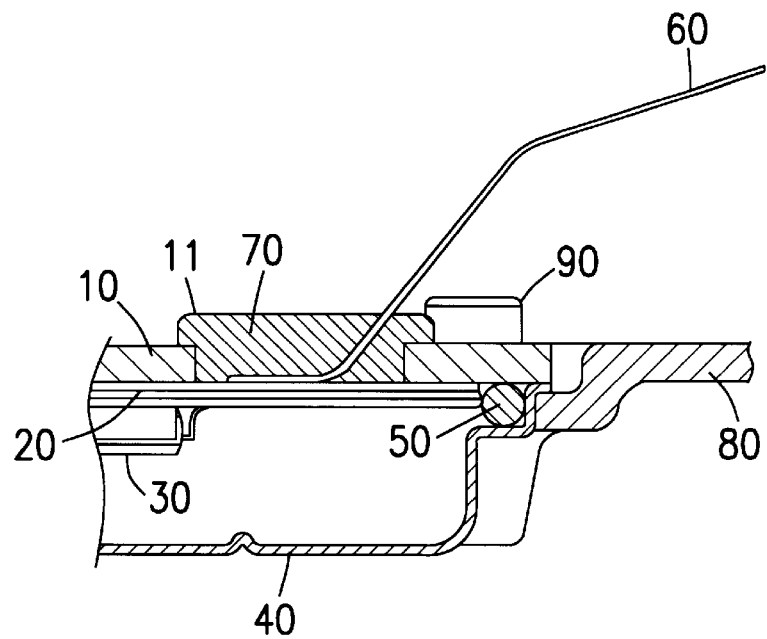
FIG. 1 shows a first exemplary embodiment of an arrangement according to the present invention for mounting a wiring harness to a support plate.

An exemplary embodiment of an arrangement for mounting a wiring harness 60 to a metal support plate 10 with laminated-on substrate 20 is depicted in FIG. 1. As is evident from FIG. 1, support plate 10 has, in the vicinity of the connection between the connecting wires of wiring harness 60 and connection elements (not depicted) of substrate 20, a recess 11 in which is arranged a sealing medium 70 which surrounds the entire recess 11 and thus also the connection between the connecting wires of wiring harness 60 and the connection elements of substrate 20.

Sealing medium 70 can be composed, for example, of polyurethane or silicone or the like; it simultaneously performs the function of a strain relief, since at least a portion of wiring harness 60 is embedded in sealing medium 70.

The connection elements on substrate 20 are, for example, solder terminals which constitute contact points, for example, for punch soldering to the wiring harness.

As is further evident from FIG. 1, electrical and/or electronic components 30 are arranged on substrate 20, for example (as depicted) on the side of substrate 20 facing away from the connection. These components are located in a housing, closed off by a housing cover 40, of a control device for a motor vehicle, which is mounted, for example directly with mounting elements 90 for example in the form of bolts, onto a component of the internal combustion engine, for example an air filter housing 80.

Arranged between housing cover 40 and support plate 10 is a sealing and/or adhesive medium 50 for sealing against environmental influences. In this context, metal support plate 10 itself constitutes one outer wall of the housing, on which wiring harness 60 can be arranged particularly easily in the manner described above.

Figure 2:
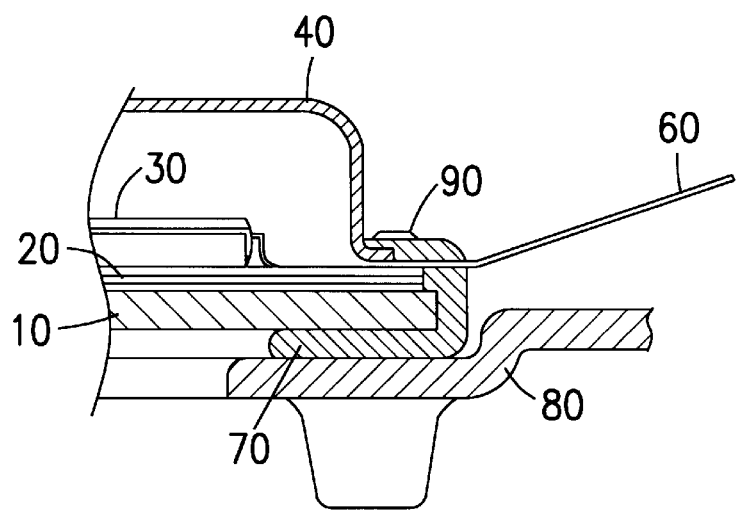
FIG. 2 shows a second exemplary embodiment of an arrangement according to the present invention for mounting a wiring harness to a support plate.

The exemplary embodiment depicted in FIG. 2 differs from the one depicted in FIG. 1 in that the electrical connecting wires of wiring harness 60 are arranged on the same side of substrate 20 on which the electrical and/or electronic components 30 are also arranged. In this instance, sealing medium 70 simultaneously constitutes a seal between housing cover 40 and support plate 10 and a mount, which seals with respect to the environment, for wiring harness 60 guided into the housing. With this arrangement as well, sealing medium 70 also performs the duties of a strain relief.

Figure 3:
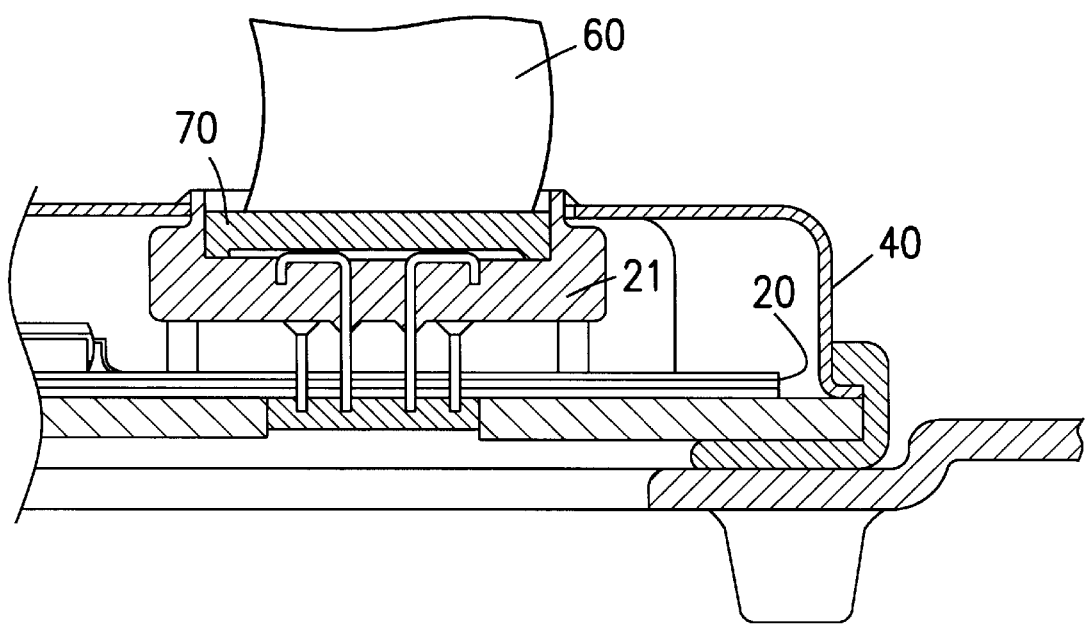
FIG. 3 shows a third exemplary embodiment of an arrangement according to the present invention for mounting a wiring harness to a support plate.

As shown in the further embodiment, depicted in FIG. 3, of an arrangement for mounting a wiring harness 60 to a metal support plate 10 with laminated-on substrate 20, it is also possible to connect the connecting wires of wiring harness 60 in electrically conductive fashion not directly to connection elements on the surface of substrate 20, but rather via a soldered-in or pressed-in post block 21. With this post block 21, it is possible for the contact point of wiring harness 60 to be guided to an outer wall of the housing—in the present case to a housing cover 40—so that wiring harness 60 does not need to be guided into the housing itself up to substrate 20.

Advantages of the exemplary embodiments described above are that, because of the direct connection of the connecting wires of wiring harness 60 to connection elements of substrate 20, no additional edge connectors or the like (which are subject to malfunction in terms of contact breaks, corrosion, and the like) are necessary; that no additional strain reliefs are necessary; that this type of contact for wiring harness 60 is particularly simple and therefore economical to implement; and that the elimination of additional connecting elements results in a considerable weight saving.

What is claimed is:

1. An arrangement for mounting a wiring harness on a metal support plate with a laminated-on substrate for at least one of electrical components and electronic components, connecting wires of the wiring harness being electrically connected, at a connection, directly to electrical connection elements of the substrate, comprising:

a sealing medium enclosing the connection, the wiring harness being at least partly embedded into the sealing medium in a vicinity of the connection.

2. The arrangement according to claim 1, wherein the sealing medium provides a strain relief.

3. The arrangement according to claim 1, wherein the sealing medium is arranged in a recess of the support plate, in a region of the connection.

4. The arrangement according to claim 1, wherein the support plate includes an outer wall of a housing of a control device.

5. The arrangement according to claim 1, wherein the connection elements include a post block electrically connected to the substrate.

6. The arrangement according to claim 1, wherein the sealing medium is not applied to any of the electrical components and the electronic components.

* * * * *